United States Patent
Hsu

[11] Patent Number: 5,846,864
[45] Date of Patent: Dec. 8, 1998

[54] METHOD OF FABRICATING A HIGH DENSITY MASK ROM WITH RECESS CHANNELS

[75] Inventor: Chen-Chung Hsu, Taichung, Taiwan

[73] Assignee: United Microelectronics Corporation, Taiwan

[21] Appl. No.: 706,698

[22] Filed: Sep. 6, 1996

[30] Foreign Application Priority Data

Jun. 29, 1996 [TW] Taiwan ................................ 85107904

[51] Int. Cl.⁶ ............................................ H01L 21/8246
[52] U.S. Cl. ........................................... 438/276; 438/524
[58] Field of Search ................................. 438/270, 275, 438/276, 277, 278, 524, 589, 666

[56] References Cited

U.S. PATENT DOCUMENTS 5,108,937  4/1992  Tsai et al. .............................. 438/589
5,466,624  11/1995 Ong et al. ............................. 438/276
5,510,288  4/1996  Hong .................................... 438/278
5,536,670  7/1996  Hsue .................................... 438/524

*Primary Examiner*—Chandra Chaudhari
*Attorney, Agent, or Firm*—Rabin & Champagne, P.C.

[57] ABSTRACT

A high density mask ROM with recess channels is fabricated on a substrate by forming the bit lines through a number of field oxide layers having a bird's beak structure. In particular, every adjacent two bird's beaks of the field oxide layer are closely disposed or connected. The field oxide layers are used as masks for implanting ions to form the bit lines. Word lines are then formed over the substrate. The bird's beak mask results in the word lines having a wave shape. The resulting construction also has recessed channels between adjacent bit lines.

5 Claims, 4 Drawing Sheets

– continued –

METHOD OF FABRICATING A HIGH DENSITY MASK ROM WITH RECESS CHANNELS

BACKGROUND OF THE INVENTION

1. Field of the Invention

The invention relates in general to the fabrication of a high density mask read only memory (ROM), and more particularly to a method of fabricating a high density ROM with a recess channel.

2. Description of the Related Art

The applications of memory are very broad. For use in thin, light, short and small computer products, there is now a great deal of interest in the development of memories with high capacitance, small volume and high speed. In such computer products, high density memories with buried bit lines are widely used, due to the advantages of their small area. In particular, the mask ROM with buried bit lines is popular. A conventional mask ROM with buried bit lines is taken as an example to illustrate parts of a conventional process of manufacture.

First, referring to FIG. 1A, a silicon nitride layer (not shown) is formed on a predetermined area for an active region 12 on a silicon substrate 10. Then, by thermal oxidation, a field oxide layer 14 is formed on the substrate 10, outside of the active region 12. The silicon nitride layer is then removed, leaving the active region 12 now defined. Next, a pad oxide layer 16 is formed on the surface of the active region 12.

Next, referring to FIG. 1B, after a photoresist layer 18 is deposited on the pad oxide layer 16, the photoresist layer 18 is patterned to expose a predetermined region for bit lines. Then, the substrate 10 is doped using ion implantation or diffusion, to form bit lines 22.

Then, referring to FIG. 1C, the photoresist layer 18 and the pad oxide layer 16 are removed. Next, a gate oxide layer 24 is formed on the surface of the silicon substrate 10, and a polysilicon layer 26 is then deposited on the gate oxide layer 24. After that, the polysilicon layer 26 and the gate oxide layer 24 are patterned in a direction parallel to the plane of the cross-section to form the word lines.

Finally, referring to FIG. 1D, a photoresist layer 28 is deposited and patterned by a designed mask to expose a code area 30. Then, encoding is performed by ion implantation.

Though not shown in FIG. 1A through FIG. 1D, it is preferable that the structure shown in FIG. 1D be subjected to further conventional processing to complete a mask ROM, such as by forming a bonding pad, an interconnection, a passivation and a package.

The requirement for higher density memories has become crucial. For a high density flat cell memory with buried bit lines, shrinking the size of every memory cell is one of the most economic and effective methods. However, a by-effect of shrinking the memory cell is the undesirable short channel effect.

SUMMARY OF THE INVENTION

It is therefore an object of the invention to provide a method for fabricating a high density mask ROM with recess channels. Such a mask ROM can be highly integrated without experiencing the short channel effect problem.

A method of fabricating a high density mask ROM in accordance with the object of the invention includes defining an active region on a substrate, forming a number of field oxide layers with bird's beak structures on a predetermined region of the substrate, and forming a plurality of bit lines underlying the substrate and disposed between every two adjacent field oxide layers, by ion implantation. Then, the field oxide layers are removed and a gate oxide layer is formed on the substrate. A polysilicon layer is formed on the gate oxide layer, and then the gate oxide layer and the polysilicon layer are patterned to form a plurality of word lines.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1A:
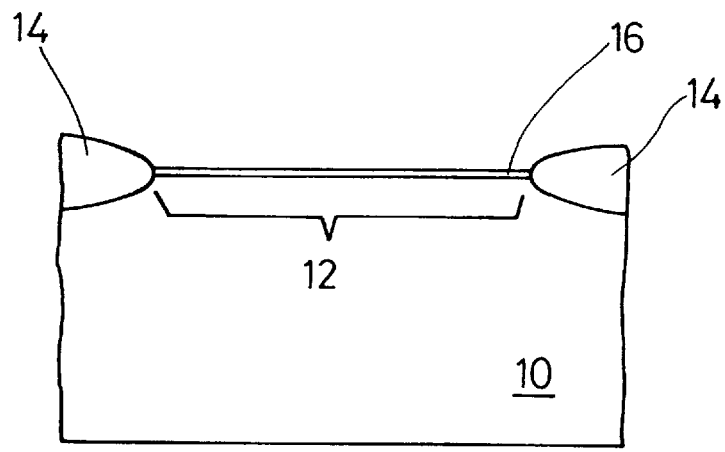
FIGS. 1A to 1D (Prior Art) are cross-sectional views showing conventional process steps of fabricating a mask ROM with a buried bit line.
Figure 1B:
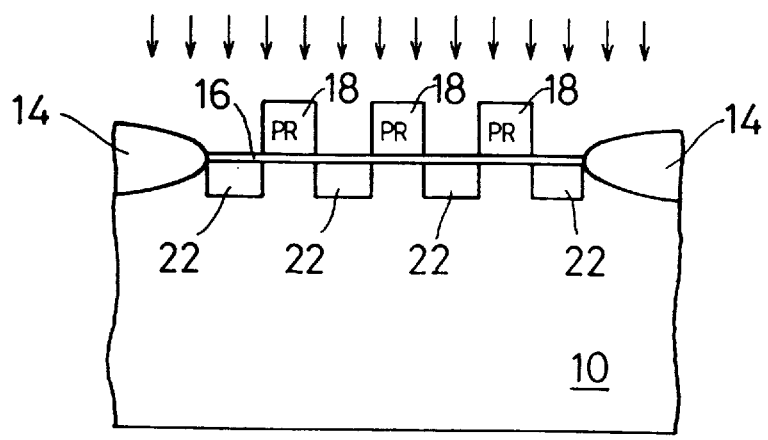
Figure 1C:
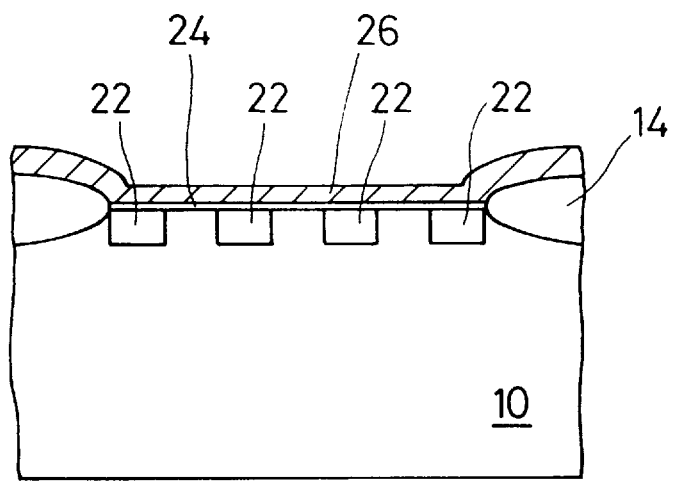
Figure 1D:
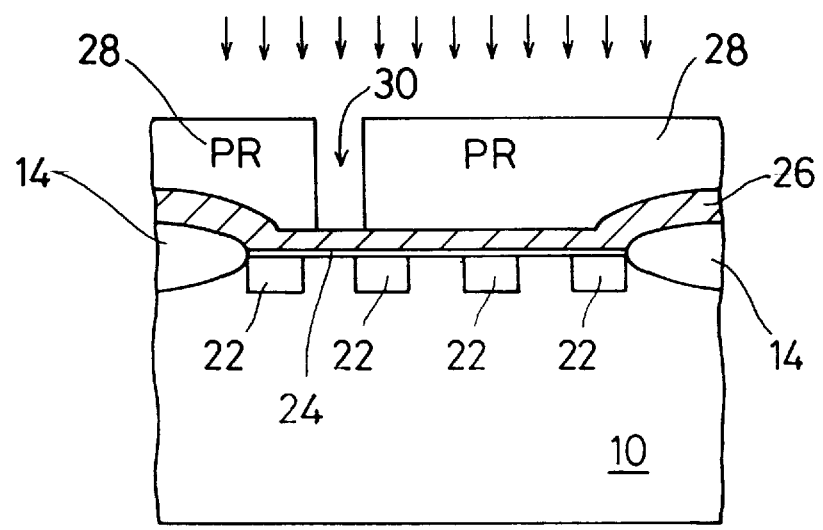
Figure 2A:
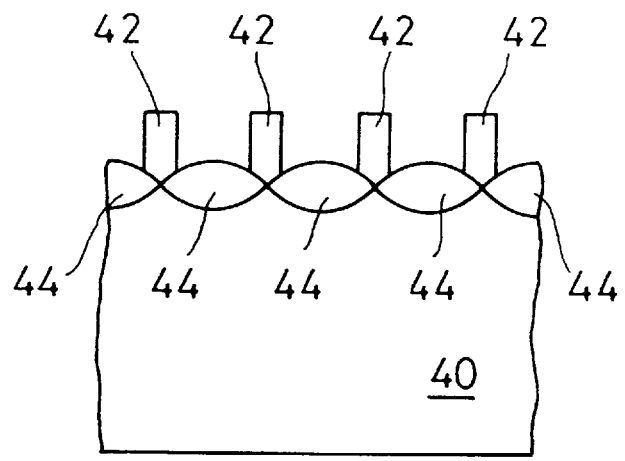
FIGS. 2A to 2D are cross-sectional views showing the process steps of fabricating a high density mask ROM with recess channels, according to the preferred embodiment of the invention.

Referring first to FIG. 2A, a silicon nitride layer 42 is formed on a predetermined area for bit lines, on a silicon substrate 40. Next, field oxide layers 44 with "bird's beak" structures are formed by thermal oxidation on the exposed silicon substrate 40. The distance between every two adjacent field oxide layers is adjusted according to different requirements, so that the bird's beaks of every two adjacent field oxide layers can be either connected or only closely adjacent. However, they are preferably connected.

Figure 2B:
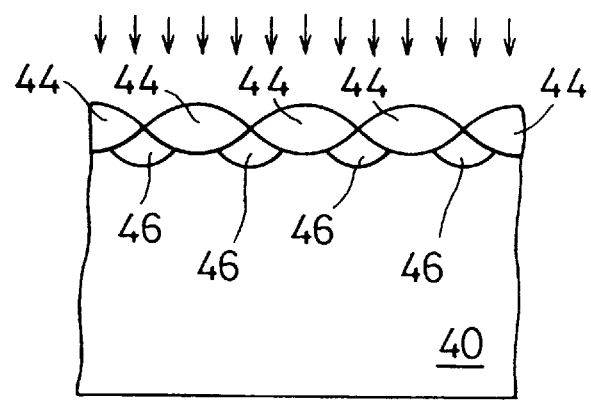

Then, referring to FIG. 2B, the silicon nitride layer 42 is removed. The silicon substrate 40 is implanted with ions by means of a self-alignment technique, to form a number of bit lines 46. For an N-type metal oxide semiconductor (NMOS) device, the bit lines 46 are formed preferably by implanting arsenic at an energy of about 30 to 100 KeV to provide a dosage of about $1\times10^{14}$ to $1\times10^{16}$ atoms/cm$^2$. Due to the fact that the connected bird's beaks of the field oxide layers 44 are used as the mask for ion implantation, the cross-sectional areas of the formed bit lines 46 are smaller than is conventional, and the overall size of the device is therefore reduced.

Figure 2C:
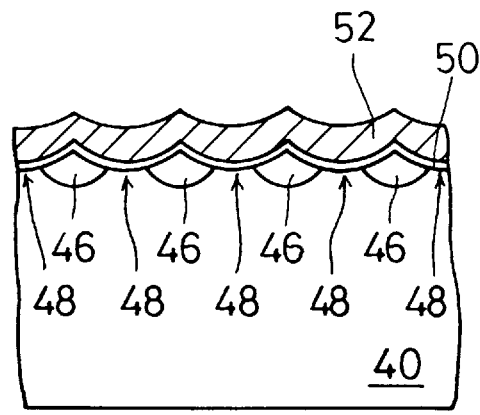

Then, referring to FIG. 2C, the field oxide layer 44 is removed so that the surface of the silicon substrate 40 displays recess features. Next, a gate oxide layer 50 with a thickness of about 60 to 250 Å is formed on the surface of the silicon substrate 40. Moreover, a polysilicon layer is deposited over the gate oxide layer 50, and then, the polysilicon layer and the gate oxide layer 50 are patterned to form word lines 52. As shown in FIG. 2C, the word lines 52 are wave-like in shape, and a recess channel 48 is formed between every adjacent two bit lines 46.

Figure 2D:
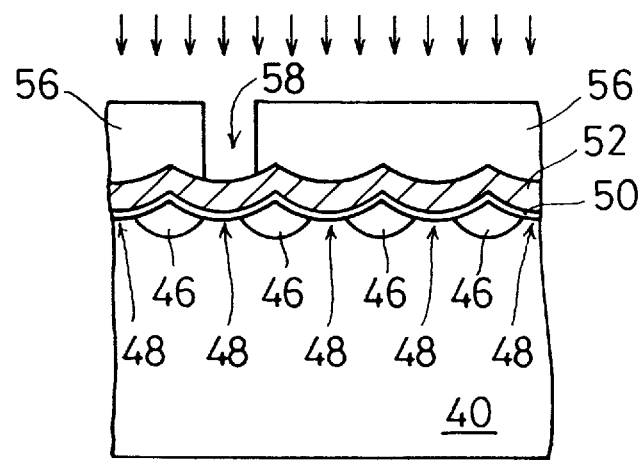

Then, referring to FIG. 2D, a photoresist layer 56 is formed and patterned according to a user requirements, to expose code areas 58. After that, ion implantation is performed, preferably by injecting boron at an energy of about 120 to 150 KeV to provide a dosage of about $5\times10^{13}$ to $5\times10^{14}$ atoms/cm$^2$, to complete the memory cell of the mask ROM. Conventional processing is then performed to complete fabrication of the desired ROM integrated circuit.

The invention has the following characteristics:

1. The channel is recessed.

2. As the horizontal widths are equal, the linear channel length of the recess channel is larger than that of a conventional straight channel. Consequently, the short channel effect is reduced.

3. As the linear channel lengths are equal, the size of the NMOS device according to the invention is much smaller than is conventional, so that integration is greatly increased.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a high density mask read only memory, comprising:

providing a substrate with and active region;

forming a plurality of field oxide layers with bird's beak structures on a predetermined region of the substrate, wherein the bird's beak structures of every two adjacent field oxide layers are connected;

performing ion implantation to form a plurality of bit lines underlying the substrate and between every two adjacent field oxide layers;

removing the field oxide layers;

forming a gate oxide layer on the substrate;

forming a polysilicon layer on the gate oxide layer; and patterning the gate oxide layer and the polysilicon layer to form a plurality of word lines.

2. A method according to claim 1, wherein the bit lines are formed by implanting arsenic at a dosage of about $1 \times 10^{14}$ to $1 \times 10^{16}$ atoms/cm$^2$ and an energy of about 30 to 100 KeV.

3. A method according to claim 1, wherein the thickness of the gate oxide layer is about 60 to 250 Å.

4. A method according to claim 1, wherein the word lines have a wave shape.

5. A method according to claim 1, wherein recessed channels are formed between adjacent bit lines.

* * * * *